(12) United States Patent
Hasegawa et al.

(10) Patent No.: US 11,994,653 B2
(45) Date of Patent: May 28, 2024

(54) TRANSPARENT MEMBER AND TRANSPARENT-MEMBER MANUFACTURING METHOD

(71) Applicant: Konica Minolta, Inc., Tokyo (JP)

(72) Inventors: Kento Hasegawa, Sakai (JP); Yasushi Mizumachi, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 898 days.

(21) Appl. No.: 16/978,609

(22) PCT Filed: Apr. 5, 2019

(86) PCT No.: PCT/JP2019/015111
§ 371 (c)(1),
(2) Date: Sep. 4, 2020

(87) PCT Pub. No.: WO2019/203024
PCT Pub. Date: Oct. 24, 2019

(65) Prior Publication Data
US 2021/0003745 A1   Jan. 7, 2021

(30) Foreign Application Priority Data

Apr. 20, 2018   (JP) ................. 2018-081269

(51) Int. Cl.
*G02B 1/18*      (2015.01)
*C23C 14/04*     (2006.01)
*G02B 1/115*     (2015.01)
*G03B 11/04*     (2021.01)

(52) U.S. Cl.
CPC .............. *G02B 1/18* (2015.01); *C23C 14/042* (2013.01); *G02B 1/115* (2013.01); *G03B 11/045* (2013.01)

(58) Field of Classification Search
CPC .. G02B 1/18; G02B 1/115; G02B 7/02; C23C 14/042; C23C 14/044; C23C 14/54; G03B 11/045
See application file for complete search history.

(56) References Cited

U.S. PATENT DOCUMENTS

2003/0003227 A1*  1/2003  Kono .................. C23C 14/06
                                              427/162
2006/0216487 A1   9/2006  Fukui
2010/0129608 A1   5/2010  Low et al.
(Continued)

FOREIGN PATENT DOCUMENTS

| CN | 101497017 A | 8/2009 |
| CN | 103320832 A | 9/2013 |
| CN | 104646833 A | 5/2015 |
| CN | 106066293 A | 11/2016 |

(Continued)

OTHER PUBLICATIONS

CNIPA, Office Action for the related Chinese Application No. 201980026769.1, dated Jul. 26, 2022, with English translation.
(Continued)

*Primary Examiner* — Alicia M Harrington
(74) *Attorney, Agent, or Firm* — LUCAS & MERCANTI, LLP (57) ABSTRACT

A transparent member according to the present invention is formed by providing at least a substrate or a layer on the substrate, and has a surface section in which the contact angle with respect to water continuously changes.

9 Claims, 6 Drawing Sheets

(56) References Cited

U.S. PATENT DOCUMENTS

2010/0201940 A1    8/2010  Santan et al.
2018/0185875 A1*  7/2018  Murakami ........... G02B 5/0247
2020/0105949 A1*  4/2020  deVos ............... H01L 31/02168

FOREIGN PATENT DOCUMENTS

| CN | 107482953 A | 12/2017 |
|---|---|---|
| CN | 107640739 A | 1/2018 |
| JP | 2005331410 A | 12/2005 |
| JP | 2015018106 A | 1/2015 |
| JP | 2020-098284 A | 6/2020 |

OTHER PUBLICATIONS

CNIPA, Office Action for the related Chinese Application No. 201980026769.1, dated Mar. 9, 2022, with English translation.
PCT, International Preliminary Report on Patentability for corresponding application No. PCT/JP2019/015111 dated Oct. 20, 2020 and English translation.
International Search Report for corresponding application No. PCT/JP2019/015111 dated Jun. 25, 2019 and English translation.
China National Intellectual Property Administration, Decision of Rejection dated Jan. 9, 2023 for the related Chinese Patent Application No. 201980026769.1, and manual English translation thereof (13 pages).
EPO, Extended European Search Report for the related European Application No. 19789336.5, dated May 3, 2021.
Office Action dated Jun. 29, 2023 for the corresponding Chinese Patent Application No. 201980026769.1, and English translation.

* cited by examiner

A straight line connecting the evaporation source and the film thickness gradient part

TRANSPARENT MEMBER AND TRANSPARENT-MEMBER MANUFACTURING METHOD

CROSS REFERENCE TO RELATED APPLICATION

This Application is a 371 of PCT/JP2019/015111 filed on Apr. 5, 2019 which, in turn, claimed the priority of Japanese Patent Application No. 2018-081269 filed on Apr. 20, 2018, both applications are incorporated herein by reference.

TECHNICAL FIELD

The present invention relates to a transparent member and a method of manufacturing the transparent member. More particularly, the present invention relates to a transparent member which can remove water droplets on a surface by a simple method and can clearly maintain a photographed image when used in a lens.

BACKGROUND

For example, for driving support of the vehicle, it is performed to mount the vehicle-mounted camera to the vehicle. More specifically, a camera for imaging the rear or side of the vehicle is mounted on the vehicle body of the vehicle, to reduce the blind spot by displaying the image captured by the camera in a position visible to the driver, thereby contributing to safe driving. Incidentally, the vehicle-mounted camera is often attached to the outside of the vehicle, and water droplets are often attached by rain on the lens. Depending on the degree of water droplets adhering to the lens, distortion occurs in the image captured by the camera, there is a fear that visibility is deteriorated.

Conventionally, as a technique for transporting a minute amount of droplets, a technique for transporting a droplet to a weaker hydrophobic surface and a larger area by arranging regions having different hydrophobic surfaces in a wedge shape has been disclosed (for example, see Patent Document 1). However, when trying to apply the technique to the lens of the imaging system, since the boundary is present in regions with different contact angles, the optical characteristics are rapidly changed, and there is a problem that the image is disturbed. In addition, a semiconductor process is required to cope with micro water droplets below the dimensions of the pattern, and the productivity is significantly reduced, consequently, it is difficult to transport such micro water droplets.

Further, a technique is disclosed in which a hydrophilic coating and a water-repellent coating are applied to a surface of a lens, regions having different contact angles are provided on the same surface, and water droplets are concentrated and guided to one point in a guide at a boundary portion of the region (for example, see Patent Document 2). However, the removal of water droplets is left to its own weight, and there is no force for moving water droplets to the lens surface itself, and the hydrophilic coating and the water-repellent coating are only a guide role for controlling the direction of movement when water droplets naturally fall.

PRIOR ART DOCUMENTS

Patent Documents

Patent Document 1: JP-A2005-331410
Patent Document 2: JP-A 2015-018106

SUMMARY OF THE INVENTION

Problems to be Solved by the Invention

The present invention has been made in view of the above-mentioned problems and situation, and an object of the present invention is to provide a transparent member and a method of manufacturing a transparent member which can remove water droplets on a surface by a simple method and can clearly maintain a photographed image when used in a lens.

Means to Solve the Problems

In order to solve the above-mentioned problems, the present inventor has found that, in the process of examining the problem of the above-mentioned problems, by forming a surface portion in which the contact angle with respect to water changes continuously, it is possible to easily remove water droplets adhering to the surface, and to provide a transparent member capable of clearly maintaining a photographed image. In other words, the above problem according to the present invention is solved by the following means.

1. A transparent member comprising at least a base material or a base material provided with a layer on the base material, wherein the transparent member has a surface portion whose contact angle to water changes continuously.
2. The transparent member according to item 1, wherein the surface portion is included in a water-repellent layer.
3. The transparent member according to item 2, wherein a thickness of the water-repellent layer changes continuously.
4. The transparent member according to item 2 or 3, wherein the water-repellent layer contains a fluoride.
5. The transparent member according to any one of items 2 to 4, wherein an antireflection layer is provided on a rear surface of the water-repellent layer.
6. The transparent member according to any one of items 1 to 5, wherein a surface roughness of the surface portion changes continuously.
7. The transparent member according to any one of items 1 to 6, being used in an optical component for vehicle use or outdoor use.
8. The transparent member according to item 7, wherein the optical component is an optical lens.
9. A method for manufacturing a transparent member according to any one of items 1 to 8, comprising the step of forming a water-repellent layer by forming a film of a water-repellent material, wherein a thickness of the water-repellent layer changes continuously.
10. The method for manufacturing a transparent member according to item 9, wherein the step of forming a water-repellent layer uses either a vapor deposition method or a coating method.

Effects of the Invention

According to the above-mentioned means of the present invention, it is possible to provide a transparent member and a method of manufacturing the transparent member which can remove water droplets on the surface by a simple method and can clearly maintain a photographed image when used in a lens. The expression mechanism or action mechanism of the effect of the present invention is not clarified, but is inferred as follows. Since the surface portion has a continuously changing contact angle with respect to water, a force (driving force) for moving the water droplet is applied to the surface portion regardless of the amount of change in the contact angle. Therefore, when a water droplet adheres to the surface portion, the water droplet naturally slides down in the direction of decreasing the contact angle, and the water droplet is removed from the surface portion. Therefore, when such a transparent member is used for a lens used outdoors, such as a vehicle-mounted camera or a surveillance camera, the photographed image is not distorted and the visibility is improved. In addition, water droplets are difficult to adhere to the lens, and good visibility may be maintained even in bad weather conditions.

EMBODIMENTS TO CARRY OUT THE INVENTION

The transparent member of the present invention is at least a transparent member comprising a base material or a base material provided with a layer on the base material, and has a surface portion in which a contact angle to water changes continuously, and the flow direction of water adhering to the surface portion is controlled. This feature is a technical feature common to or corresponding to each of the following embodiments.

As an embodiment of the present invention, it is preferable that the surface portion is contained in the water-repellent layer in view of excellent water droplet removal. In addition, it is preferable that the thickness of the water repellent-layer changes continuously in terms of more conveniently removing water droplets. It is preferable that the water-repellent layer contains a fluoride in view of easy adjustment of the contact angle with respect to water and large contact angle. It is preferable to have an antireflection layer on the rear surface of the water-repellent layer from the viewpoint of excellent optical performance. It is preferable that the surface roughness of the surface portion changes continuously in terms of controlling the flow direction of water by changing the surface energy. It is preferable to be used for an optical component for vehicle use or outdoor use in terms of preventing water droplets from adhering due to rain and obtaining good visibility. In particular, it is preferable that the optical component is an optical lens.

The method of manufacturing a transparent member of the present invention includes a step of forming a water-repellent layer by forming a film of a water-repellent material, and in the above-mentioned step, the thickness of the water-repellent layer changes continuously. In the above step, it is preferable to use either the vapor deposition method or the coating method because water droplets may be more easily removed.

Hereinafter, the present invention and the constitution elements thereof, as well as configurations and embodiments to carry out the present invention, will be detailed in the following. In the present description, when two figures are used to indicate a range of value before and after "to", these figures are included in the range as a lowest limit value and an upper limit value.

[Summary of the Transparent Member]

The transparent member of the present invention is a transparent member comprising at least a base material or a base material provided with a layer on the base material, and has a surface portion in which a contact angle to water changes continuously.

In the present invention, "changes continuously" means that the difference between the maximum value and the minimum value of the contact angle in a specific region is preferably 10° or more, and when the difference is 10° or more, a force (driving force) for sufficiently moving the water droplet acts. In particular, when the transparent member of the present invention is used for a lens for a vehicle-mounted camera, it is preferable to set the contact angle to 40° or more. In addition, the larger the amount of change in the contact angle, the greater the force for moving the water droplet, and the smaller the amount of change, the smaller the force for moving the water droplet, but in the region where the contact angle continuously changes, the force for moving the water droplet acts regardless of the amount of change. When the transparent member of the present invention is used in a circular lens, for example, it is preferable to set the amount of change from the center of the lens to the outside in the radial direction to be as large as possible. The maximum contact angle itself does not necessarily have to be large (i.e., it does not have to be a water-repellent surface). In addition, the amount of change in the contact angle may not be constant for the purpose of water droplet removal. The necessary width for the region where the contact angle changes continuously is preferable 1 mm or more. When the width is less than 1 mm, there is a concern that the optical characteristics may change abruptly. When the transparent member of the present invention is used for a lens for a vehicle-mounted camera, it is preferable that the contact angle changes in a portion where water droplets are to be removed, that is, in the entire optical effective diameter region of the lens, and it is more preferable that the entire surface of the lens excluding the effective diameter be a region where the contact angle changes, because water droplets may be completely removed from the lens surface.

Figure 1A:
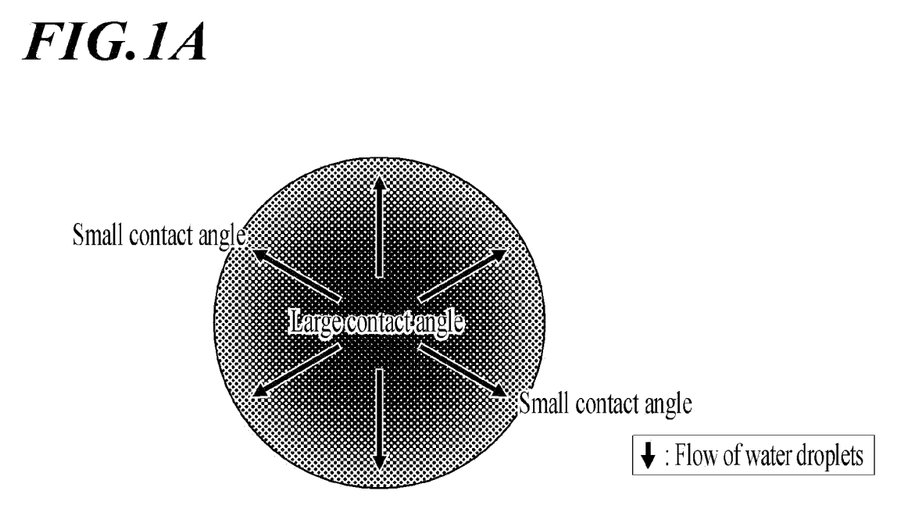
FIG. 1A is a plan view of a surface portion of a transparent member (lens) showing a pattern example of contact angle change.
Figure 1B:
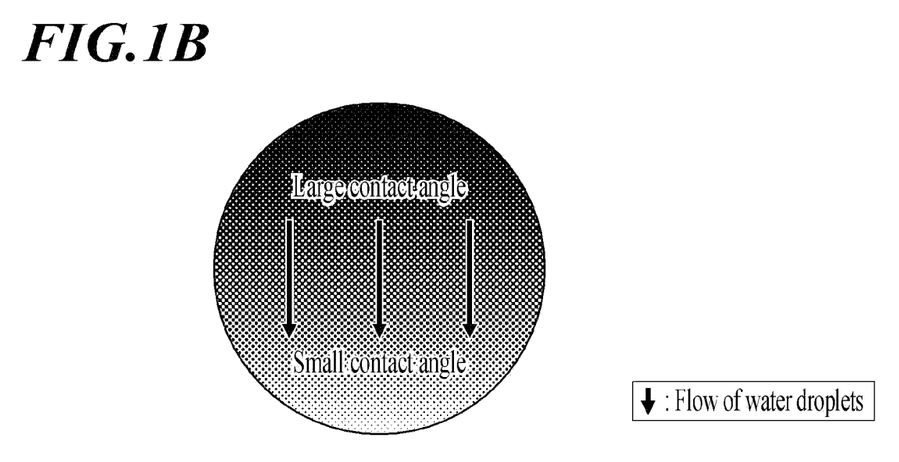
FIG. 1B is a plan view of a surface portion of a transparent member (lens) showing a pattern example of contact angle change.

Specifically, a pattern example of the contact angle change is shown in FIG. 1. FIG. 1A and FIG. 1B are plan views of front surfaces of lenses which are transparent members. FIG. 1A varies so that the contact angle decreases continuously from the center of the lens toward the outside (radial direction). In this case, the water droplet may be removed by moving in the radial direction of the lens, which is the same as the existing lens, and may be used as it is without restricting the orientation of the lens. In FIG. 1B, from one end of the outer periphery of the lens, the contact angle toward the other end facing the one end portion changes so as to be continuously small. In this case, water droplets may be moved to and removed from the other end of the lens. When the lens is tilted, water droplets may be removed in one direction.

Figure 2:
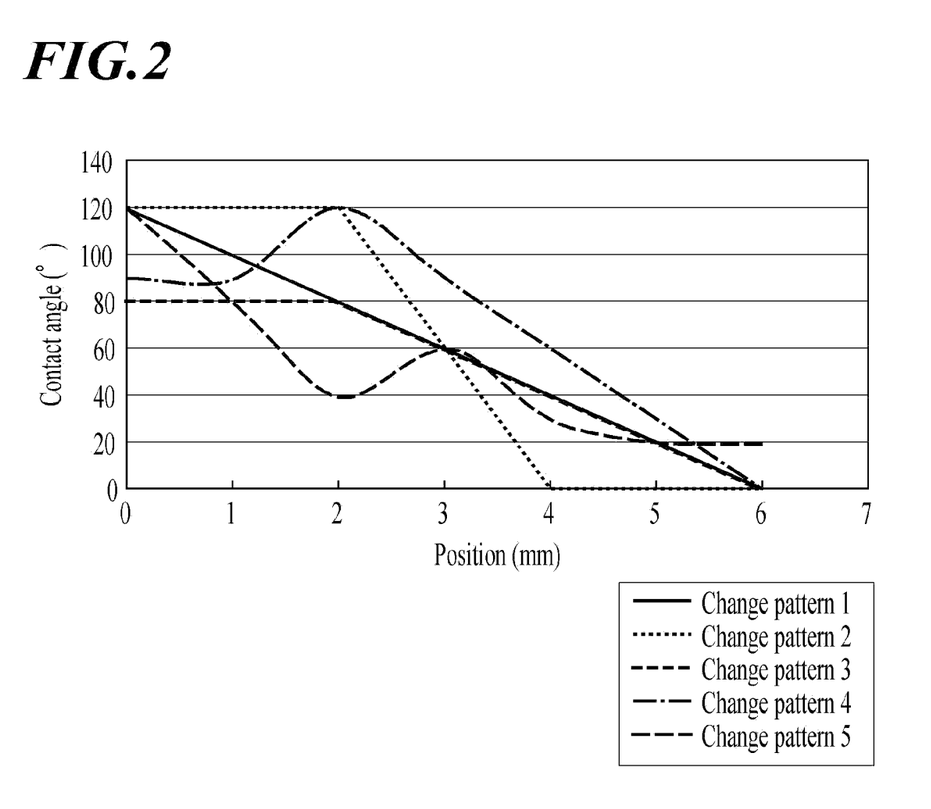
FIG. 2 is a diagram showing a pattern example of contact angle change.

Another pattern example of the contact angle change is shown in FIG. 2. In FIG. 2, the horizontal axis represents the surface position (distance from the start point of the water droplet in the portion where the water droplet moves) when the cross section of the transparent member in the water droplet movement direction is viewed, and the vertical axis represents the contact angle with water.

As a method of forming the surface portion in which the contact angle continuously changes as described above, although described later, since the contact angle depends on the thickness, it is preferable to provide a slope so as to continuously change the thickness of the water-repellent layer constituting the surface portion.

<Measuring Method of Contact Angle>

The contact angle may be measured by a known method. For example, the measurement is performed in accordance with the method defined in JIS R3257. The measurement conditions are set to a temperature of 25±5° C. and a humidity 50±10%. As a specific procedure, about 1.5 μL of water (distilled water) is dropped onto the transparent member, and five points on the transparent member are measured by a solid-liquid interface analyzer (Drop Master 500, manufactured by Kyowa Interface Sciences Co., Ltd.), and an average contact angle is obtained from the average of the measured values. The time of the contact angle measurement is 1 minute after dropping water.

<Configuration of Transparent Member>

Figure 3:
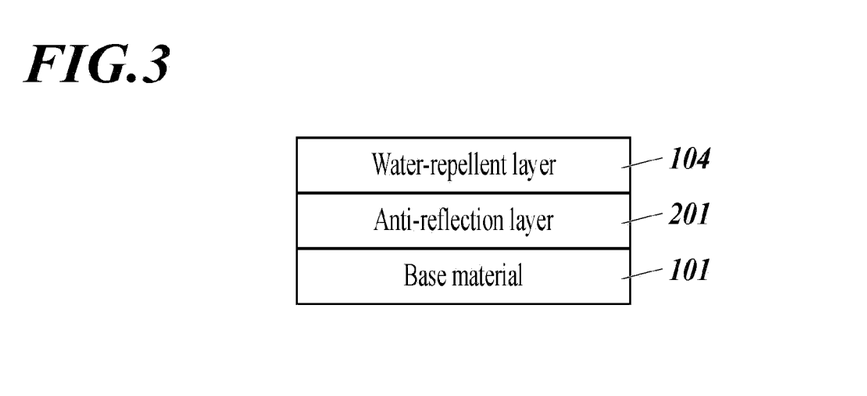
FIG. 3 is a cross-sectional view of a transparent member of the present invention.

The transparent member of the present invention comprises at least a base material or a base material provided with a layer on the base material. In other words, the base material itself may have a surface portion whose contact angle with respect to water varies continuously, or the layer provided on the base material may have a surface portion whose contact angle with respect to water varies continuously. In the transparent member of the present invention, it is preferable that the surface portion is contained in the water-repellent layer, and it is preferable that the water-repellent layer is provided on the base material. The transparent member of the present invention preferably has an antireflection layer formed by laminating a low refractive index layer and a high refractive index layer between a base material and a water-repellent layer. As a preferred configuration of the transparent member of the present invention, as shown in FIG. 3, it is a configuration in which an antireflection layer 201 and a water-repellent layer 104 are provided on a base material 101 in this order from the side of the base material 101. The surface side of the water-repellent layer 104 is a side in contact with air.

(Base Material)

Examples of the base material include glasses and resins. Examples of the resin are a polycarbonate resin and a cycloolefin resin.

(Water-Repellent Layer)

The water-repellent layer is provided on the base material and has a surface portion whose contact angle with respect to water varies continuously. In other words, since the contact angle with respect to water depends on the thickness, it is preferable that the thickness of the water-repellent layer having a surface portion changes continuously. Further, it is more preferable that the surface roughness of the water-repellent layer, which is the surface portion, changes continuously.

When, for example, a fluoride is used as a constituent material of the water-repellent layer, the contact angle of the water-repellent layer with respect to water is preferably within a range of not less than a contact angle to water of the base material and not more than 120°. In order to achieve such a contact angle, it is preferable that the thickness of the water-repellent layer located at the center of the base material is 16 nm, for example, the thickness of the water-repellent layer is formed to be continuously thin in the radial direction of the base material, and the thickness of the water-repellent layer on the end portion of the base material is formed to be 0 nm. The thickness of the center of the water-repellent layer is preferably within a range of 16 to 50 nm, and the thickness of the water-repellent layer on the radial end side is preferably within a range of 0 to 15 nm in view of sufficiently securing the water-repellent performance.

The arithmetic average roughness Ra of the surface of the water-repellent layer preferably changes continuously within a range of 0.1 to 3 nm in terms of good water droplet removal. In order to obtain such a surface roughness, it may be formed by, for example, etching, or blasting, which will be described later. The arithmetic average roughness, according to JIS B 0601:2001, is a value measured using AFM (atomic force microscopy). Specifically, Dimension Icon (manufactured by Bruker Co., Ltd.) was used, and the measuring area was set to 10 μm×10 μm.

As a constituent material of the water-repellent layer, a fluoride is preferable because it is easy to adjust the contact angle with respect to water, and it is particularly easy to secure a high contact angle. Examples of the fluoride include a fluororesin material. A commercially available products is preferably SURFCLEAR 100 (SC-100) in a tablet form (Canon Optron, Inc.). In addition, it may be in a liquid form other than the tablet shape.

(Antireflection Layer)

The antireflection layer preferably has a multilayer structure in which a high refractive index layer and a low refractive index layer are alternately stacked. The high refractive index layer according to the present invention is a layer having a refractive index higher than that of the base material, and the low refractive index layer according to the present invention is a layer having a refractive index lower than that of the base material. The refractive index of the high refractive index with respect to the wavelength of 587.56 nm is preferably within a range of 1.9 to 2.45, and the refractive index with respect to the wavelength of 587.56 nm of the low refractive index is preferably within a range of 1.3 to 1.5.

As a material used for the antireflection layer according to the present invention, a dielectric material is preferably used. Suitable examples thereof are oxides of Ti, Ta, Nb, Zr, Ce, La, Al, Si, and Hf, and oxidized compounds combining these compounds. By stacking multiple layers of different dielectric materials, it is possible to add a function of reducing the reflectivity of the entire visible range.

Although the number of laminated layers depends on the required optical performance, it is preferable that the reflectivity of the entire visible range be reduced by laminating approximately 3 to 5 layers, and that the upper limit number be 12 layers or less in view of preventing the film from being peeled off due to an increase in the stress of the film.

As a specific configuration of the antireflection layer according to the present invention, it is preferable that a low refractive index layer, a high refractive index layer, a low refractive index layer, a high refractive index layer, and a low refractive index layer are sequentially arranged from the base material side. It is preferable that a water-repellent layer is provided on the low refractive index layer of the uppermost layer of the antireflection layer, but it is not limited to these layer configurations.

The low index layer is composed of a material having a lower index than the base material, and is preferable, for example, $SiO_2$, or a mixture of $SiO_2$ and $Al_2O_3$. In particular, it is preferable to provide a layer made of $SiO_2$ directly below the water-repellent layer in terms of strong bonding between $SiO_2$ and the fluoride in the water-repellent layer.

The low refractive index layer may be formed on the base material by a known method such as a vacuum deposition method, a sputtering method, or an ion plating method, but it is particularly preferable to form the low refractive index layer by a vacuum deposition method. In addition, IAD (Ion Assisted Deposition) (hereinafter, simply referred to as "IAD") may be used in the vacuum deposition method, whereby scratch resistance is improved.

It is preferable that the high refractive index layer is made of a material having a higher refractive index than the base material, and it is, for example, a mixture of an oxide of Ta and an oxide of Ti, or otherwise, an oxide of Ti, an oxide of Ta, a mixture of an oxide of La and an oxide of Ti. Commercially available products of oxides of Ta and oxides of Ti ($Ta_2O+TiO_2$) include OA-600 (manufactured by Canon Optron, Inc.).

The high refractive index layer may be formed on the base material by a known method such as a vacuum deposition method, a sputtering method, or an ion plating method, but it is particularly preferable to form the high refractive index layer by a vacuum deposition method. In addition, in the vacuum deposition method, IAD may be used, which improves scratch resistance.

The thickness of the antireflection layer (the total thickness when a plurality of layers are stacked) is preferably in the range of 50 nm to 5 μm. When the layer thickness is 50 nm or more, it is possible to exhibit the optical properties of antireflection, when the layer thickness is 5 μm or less, it is possible to prevent the surface deformation due to the layer stress generated by the antireflection layer itself.

[Method of Manufacturing Transparent Member]

The method of manufacturing a transparent member of the present invention includes a step of forming a water-repellent layer by forming a film of a water-repellent material, and in the above-mentioned step, the thickness of the water-repellent layer changes continuously.

<Step of Forming a Water-Repellent Layer>

It is preferable that, in the step of forming the water-repellent layer, the thickness of the water-repellent layer changes continuously because the contact angle of the water-repellent layer with respect to water depends on the thickness of the water repellent layer. In addition to controlling the thickness of the water-repellent layer as described above, the water-repellent layer may be formed so that the surface roughness of the water-repellent layer changes continuously, without controlling the thickness of the water-repellent layer. As a means for forming the water-repellent layer so as to continuously change its thickness, for example, when coating a water-repellent material with a mask plate, the thickness may be inclined (film thickness gradient) by using vignetting. In this case, as will be described later, it is preferable to use a vacuum deposition method. In addition, a mask plate having a different opening area depending on the position may be disposed in front of the base material to coat the water-repellent material, thereby providing a film thickness gradient. In this case, it is preferable to use a vacuum deposition method or a spray method. In addition, by forming a mask material on the uniform water-repellent layer with an inclination and etching it, it is also possible to form the water-repellent layer so that the thickness thereof changes continuously.

On the other hand, as a means for forming the water-repellent layer so as to continuously change the surface roughness, an etching method or a blasting method may be used. Specifically, the surface roughness may continuously change by forming a fine concavo-convex pattern so that the period and the depth gradually change and performing etching. Further, the surface roughness may continuously change by the blast method so that the injection amount and the speed are gradually changed. Incidentally, in addition to changing the thickness and surface roughness of the water-repellent layer, as a means for continuously changing the contact angle of the water repellent layer, the contact angle may be reduced by irradiating oxygen plasma or ozone. Therefore, by irradiating while changing the irradiation intensity, the inclination of the contact angle may be created.

In the following, a method of forming a water-repellent layer having a film thickness gradient using vignetting in a vacuum deposition method will be described.

(Vacuum Deposition Method)

Figure 4:
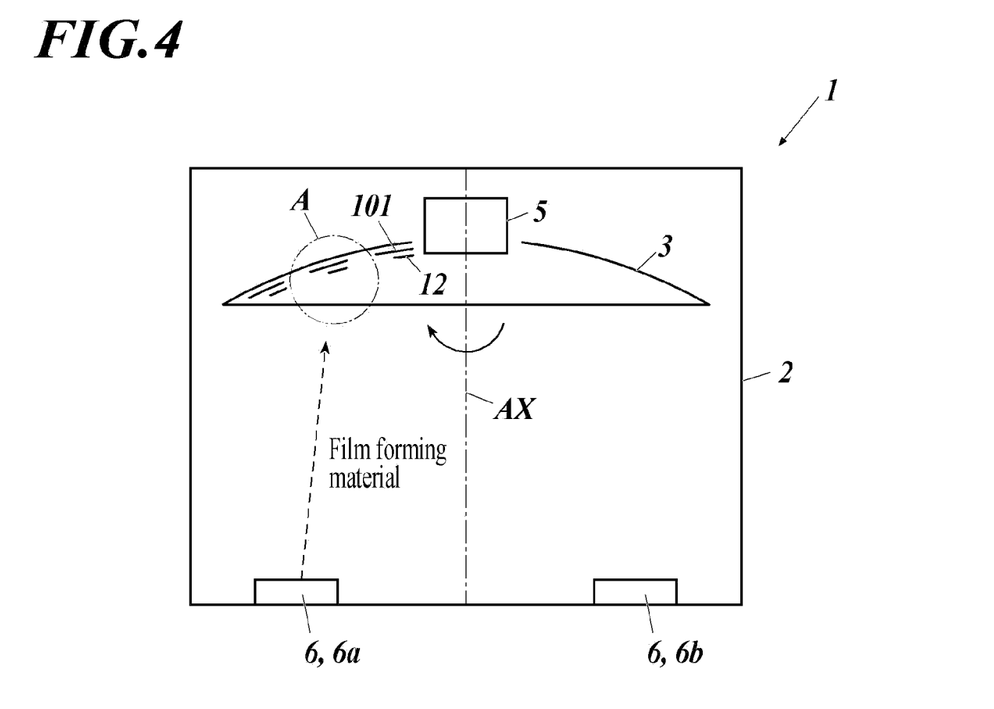
FIG. 4 is a cross-sectional view showing a schematic configuration of a vapor deposition apparatus according to the present invention.

A film-forming method using the vacuum deposition method will be described below together with a description of a vacuum deposition apparatus. As shown in FIG. 4, the vacuum deposition apparatus 1 according to the present invention includes a chamber 2, a dome 3, and a monitor system 5.

At the bottom of the chamber 2, a plurality of evaporation sources 6 are disposed. Here, as the evaporation source 6, 2 evaporation sources 6a and 6b are shown, but the number of evaporation sources 6 may be 1 or 3 or more. By heating and evaporating a film-forming material (e.g., a water-repellent material) of the evaporation source 6 and adhering the film-forming material to a base material 101 (e.g., a glass plate) installed in the chamber 2, a layer 7 (e.g., a water-repellent layer) made of a film-forming material (see FIG. 5) is formed on the base material 101. As the heating method when evaporating the film-forming material in each evaporation source 6, there are resistance heating, electron beam heating, high-frequency induction heating, or laser beam heating. Any types may be used. The chamber 2 is provided with a vacuum evacuation system (not shown), by which the interior of the chamber 2 is evacuated.

Incidentally, the mask plate 12 is provided in the chamber 2, and the details thereof will be described later.

The dome 3 holds at least one holder 21 for holding the base material 101 and the mask plate 12 (see FIG. 5), and it is also called a vapor deposition umbrella. The dome 3 has an arc-shaped cross section and has a rotationally symmetrical shape that rotates about an axis AX that passes through the center of the chord connecting both ends of the arc and is perpendicular to the chord. When the dome 3 rotates about the axis AX at a certain speed, for example, the base material 101 and the mask plate 12 held by the dome 3 via the holder 21 revolve around the axis AX at a constant speed.

The dome 3 may hold a plurality of holders 21 side by side in the rotation radial direction (revolving radial direction) and the rotation direction (revolving direction). This makes it possible to simultaneously form a film on the plurality of base materials 101 held by the plurality of holders 21, thereby improving the manufacturing efficiency of the optical element.

The monitoring system 5 monitors the characteristics of the layers formed on the base material 101 by monitoring the layers that evaporate from the evaporation sources 6 and adhere to the monitoring system 5 during vacuum deposition. By this monitoring system 5, the optical characteristics of the layer to be deposited on the base material 101 are monitored. The optical properties (e.g., transmittance, reflectance, and optical layer thickness) may be grasped. The monitoring system 5 may also include a quartz layer thickness monitor to monitor the physical layer thickness of the layer deposited on the base material 101. The monitoring system 5 also functions as a control unit for controlling switching of ON/OFF of the plurality of evaporation sources 6 in accordance with the monitoring result of the layer.

Figure 5:
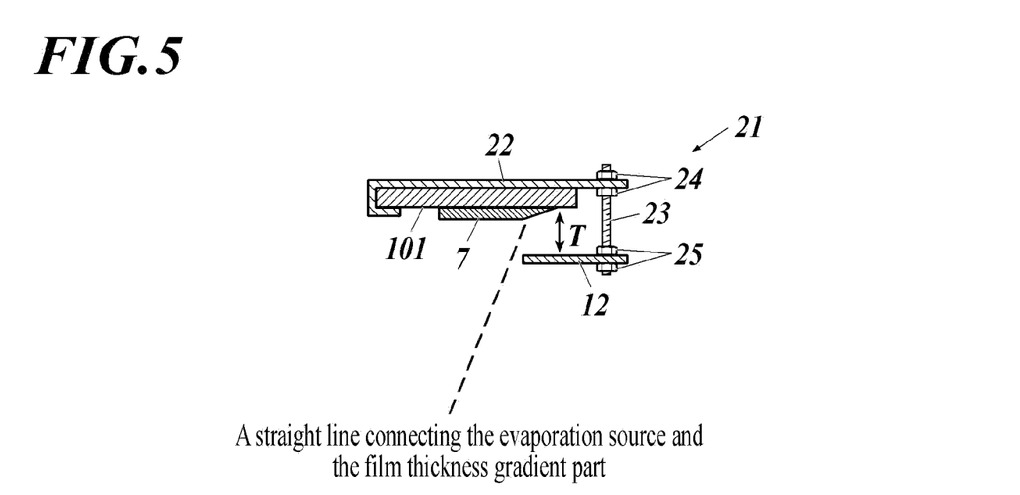
FIG. 5 is a cross-sectional view showing an enlarged portion A of FIG. 2.

FIG. 5 is an enlarged cross-sectional view showing a portion A of FIG. 4. The holder 21 is a holding member for holding the base material 101 and the mask plate 12. The holder 21 has a holding plate 22 for holding the base material 101 and a shaft 23. The shaft 23 penetrates a hole (not shown) provided in the holding plate 22 and a hole (not shown) provided in the mask plate 12. Holding plate 22 is fixed to the shaft 23 sandwiched by the nuts 24 and 24. Mask plate 12 is fixed to the shaft 23 sandwiched by the nuts 25 and 25.

By turning nuts 24 and 24 or nuts 25 and 25, it is possible to move the mask plate 12 relative to the base material 101 in the axial direction of the shaft 23. This makes it possible to adjust the distance T between the base material 101 and the mask plate 12. Incidentally, when the position of the mask plate 12 with respect to the base material 101 by the holder 21 is once fixed (the gap T is set to a predetermined value), in the film formation (film forming step), the position of the mask plate 12 (i.e., the gap T) is not changed.

Next, the details of the mask plate 12 will be described.
(Mask Plate)

Figure 6:
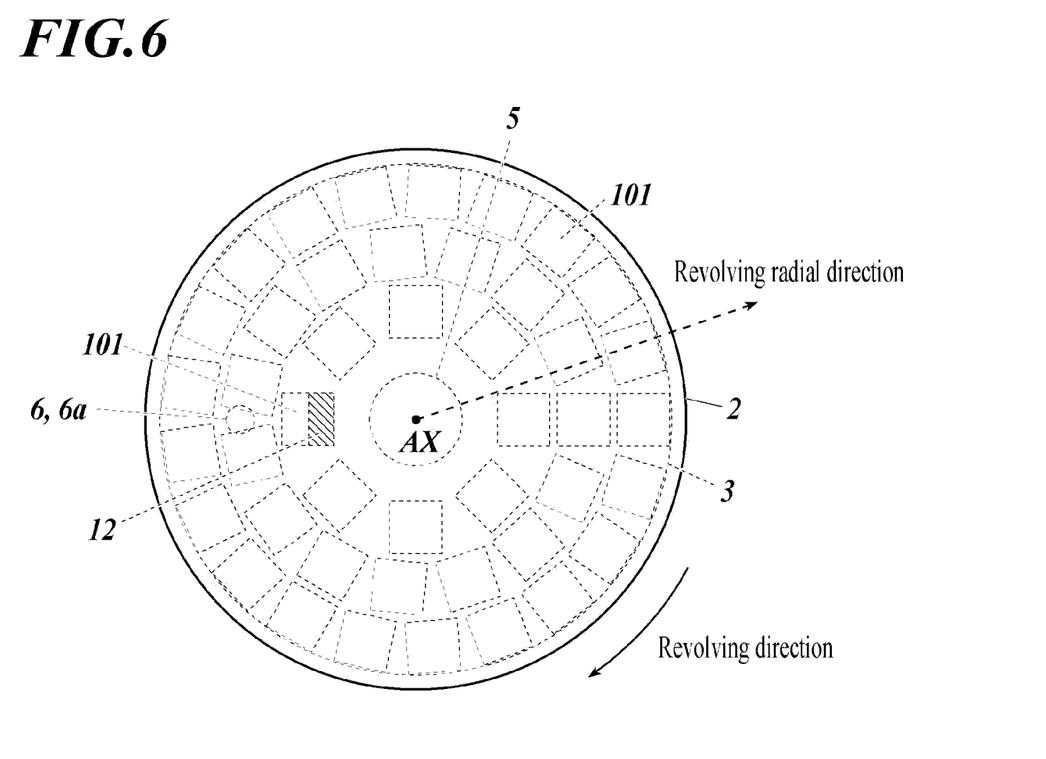
FIG. 6 is a plan view showing each base material in the vapor deposition apparatus and a mask plate corresponding to any base material.

The mask plate 12 is located on the side of the plurality of evaporation sources 6 with respect to the base material 101, and revolves together with the base material 101 in a state where a gap T is formed between the mask plate 12 and a part of the base material 101. It is held in the chamber 2 by the holder 21 described above. FIG. 6 is a plan view of each of the base materials 101 and the mask plate 12 corresponding to any base material 101 when the holder 21 holding the base material 101 and the mask plate 12 is aligned in the revolving radial direction and in the revolving direction and held on the dome 3. In order to clarify the shape of the mask plate 12, in FIG. 6, hatching is conveniently attached to the mask plate 12 (the same applies to other drawings). As shown in the figure, the width of the revolving direction of the mask plate 12 is constant in the revolving radial direction, the planar shape of the mask plate 12 has a rectangular.

By holding the mask plate 12 in the chamber 2 as described above, a film thickness gradient corresponding to the gap T may be imparted to the layer 7 (water-repellent layer) made of the film-forming material which evaporates from the evaporation source 6 and adheres on the base material 101. This point will be described in more detail as follows.

Figure 7A:
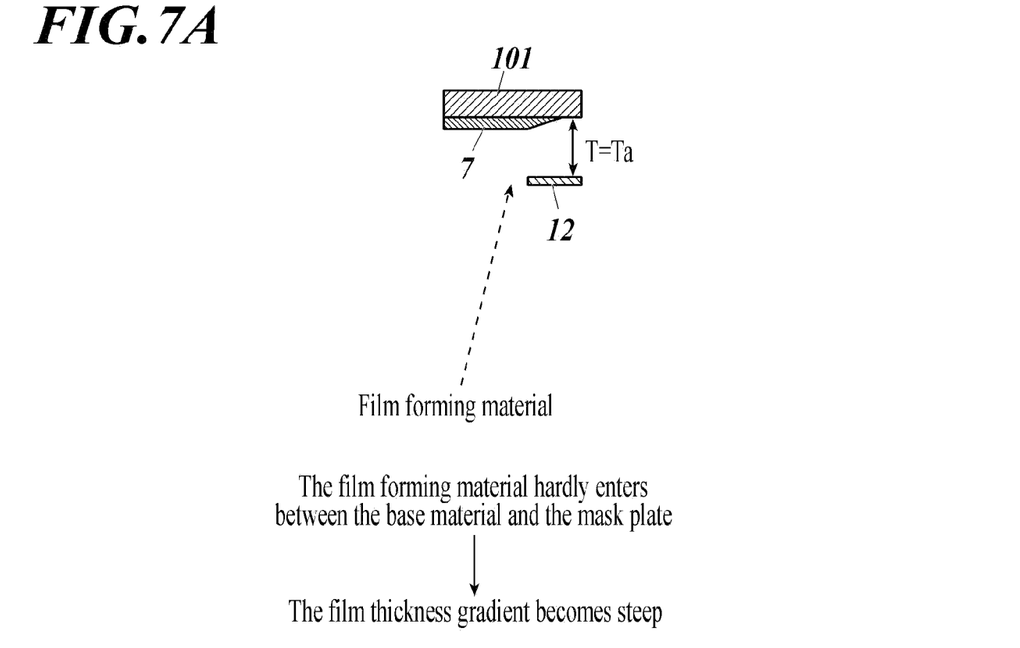
FIG. 7A is an explanatory diagram showing the principle of imparting a film thickness gradient to a water-repellent layer formed on a base material by a mask plate (when the gap T between the base material and the mask plate is narrow (gap T=Ta)).
Figure 7B:
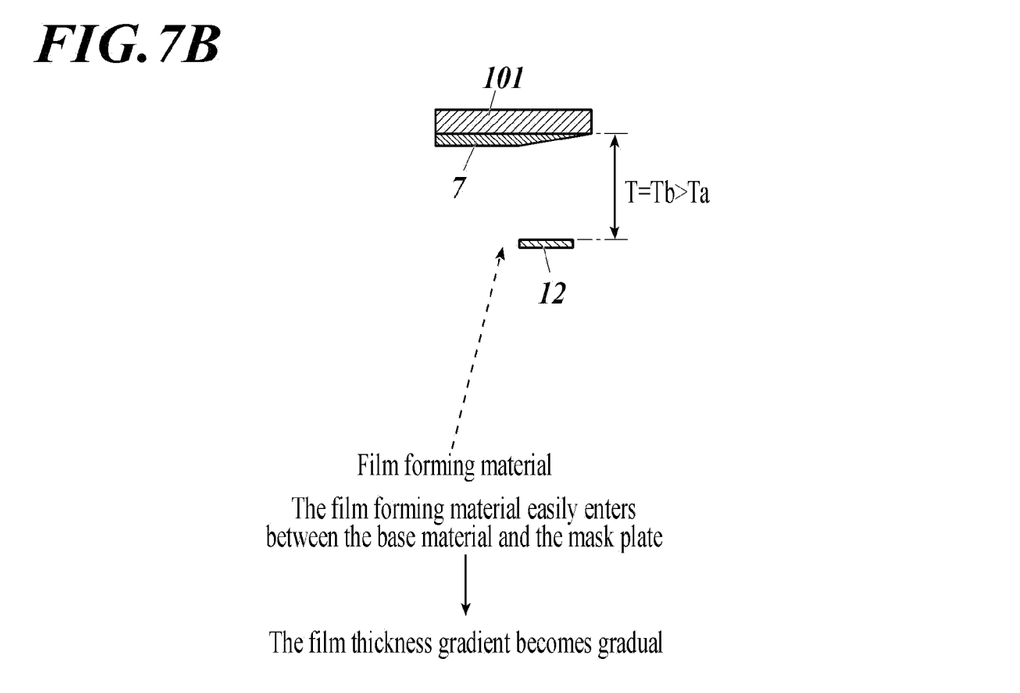
FIG. 7B is an explanatory diagram showing the principle of imparting a film thickness gradient to a water-repellent layer formed on a base material by a mask plate (when the gap T between the base material and the mask plate is wide (gap T=Tb>Ta)).

FIGS. 7A and 7B schematically show the principle that the mask plate 12 imparts a film thickness gradient to the layer 7 (water-repellent layer) formed on the base material 101. When the mask plate 12 is positioned on the side of the evaporation source 6 with respect to the base material 101, at each position in the revolving direction of the base material 101 and the mask plate 12, a part of the film-forming material from each evaporation source 6 toward the base material 101 is shielded by the mask plate 12. At this time, when the gap T between the base 101 and the mask plate 12 is narrow (the gap T at this time is Ta), the film-forming material directed toward the base 101 hardly enters the depth (up to the end portion of the base 101) between the base 101 and the mask plate 12. Therefore, the film thickness gradient of the layer 7 formed on the base material 101 becomes steep (see 7A).

On the other hand, as shown in the drawing 7B, when the gap T between the base material 101 and the mask plate 12 is wide (Tb>Ta, when the gap T at this time is Tb), the film-forming material directed toward the base material 101 without being shielded by the mask plate 12 easily enters the depth between the base material 101 and the mask plate 12. Therefore, the film thickness gradient of the layer 7 formed on the base material 101 becomes gradual.

Therefore, by arranging the mask plate 12 with a part of the base material 101 and the gap T therebetween, it is possible to impart a film thickness gradient corresponding to the gap T to the layer 7 formed on the base material 101.

In the present invention, a water-repellent material is vapor-deposited on a base material by using the above-described vapor deposition apparatus, thereby forming a water-repellent layer with a film thickness gradient which is imparted by eclipsing with a mask plate.

In the present invention, the gap T between the base material 101 and the mask plate 12 is preferably within a range of 1 to 50 mm, and more preferably within a range of 1 to 10 mm. When the optical member is large, it is preferable that the region of the film thickness gradient be large, and therefore, it is preferable that the gap T is also large. When the optical member is small, the region of the film thickness gradient may be small, and therefore, it is preferable to appropriately set the gap T.

Figure 8:
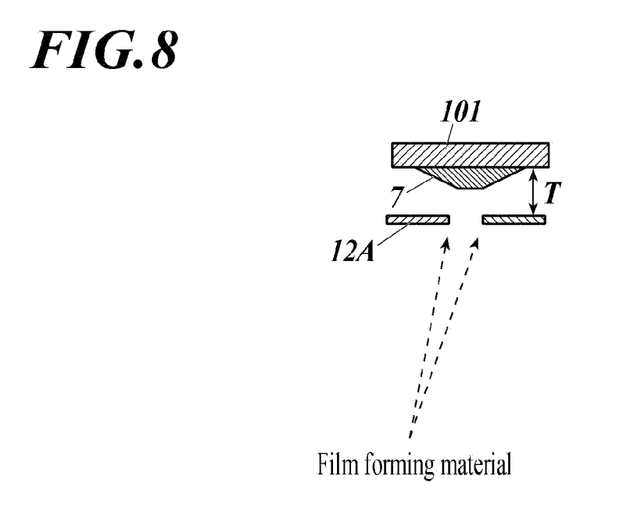
FIG. 8 is an explanatory diagram showing another example that differs from the example shown in FIG. 7A and FIG. 7B.

Incidentally, the mask plate 12, in FIG. 5, is held at one end side of the holder 21, and has been arranged so as to cover the half surface of the base material. It is not limited to this. For example, as shown in FIG. 8, a mask plate 12A having a hole formed in the center by a punch or a drill may be used, and the mask plate 12A may be configured to hold at both ends of the holder (not shown). In this case, a part of the film-forming material from the evaporation source 6 toward the base 101 is eclipsed by the mask plate 12. At this time, since the portion excluding the center portion of the base material 101 (the end portion side of the base material 101) is covered with the mask plate 12, a film thickness gradient is formed so that the center portion of the base material 101 is thickest and the thickness gradually decreases toward the end portion side of the base material 101. Similarly, when the mask plate 12A having a hole formed in the center portion is used, the film thickness gradient becomes steep when the gap T between the base material 101 and the mask plate 12 is narrow, and the film thickness gradient becomes gentle when the gap T is wide. Further, the size (opening area) of the hole formed in the central portion may be appropriately changed in accordance with the size of the region of the film thickness gradient in which the water-repellent layer is to be formed. Specifically, when a base material having a diameter of 10 mm is used, it is preferable to use a mask plate in which a hole having a diameter of 2 to 8 mm is formed in the center portion. The shape of the hole may not be a perfect circle, and irregularities may be formed on the peripheral surface that forms the hole.

(Coating Method)

In the coating method according to the present invention, it is preferable to coat a water-repellent material so that the thickness of the water-repellent layer continuously changes on the base material. Examples of the coating method include a spin coating, a dip coating, and a spray method. Among them, the spray method is preferable in that the thickness of the water-repellent layer is easily formed with continuously inclined thickness.

(Spray Method)

The spray method according to the present invention is a method of coating a water-repellent material by spraying. The thickness of the water-repellent layer may be arbitrarily controlled by the irradiation time of the spray. Further, similarly to the vapor deposition method, the thickness may be continuously changed by a method using a mask at the time of spraying.

Prior to the step of forming the water-repellent layer, a step of forming an antireflection layer on a base material may be provided. In the step of forming the antireflection layer, a film may be formed on the base material by a known method such as a vacuum deposition method, a sputtering method, or an ion plating method, but it is particularly preferable to form the film by a vacuum deposition method. In addition, in the vacuum deposition method, IAD may be used, which improves scratch resistance. In the case of using IAD, an ion gun may be provided in the above-described vapor deposition apparatus, and the drive of the ion gun may be turned on at the time of film formation to form a film.

[Optical Component for Vehicle Use or Outdoor Use]

The transparent member of the present invention is used in an optical component for vehicle use or outdoor use. Examples of the vehicle-mounted optical component of the present invention include a lens unit mounted on a vehicle-mounted camera. The "vehicle-mounted camera" is a camera installed on the outer side of the vehicle body of an automobile, and it is installed on the rear portion of the vehicle body and used for the rear confirmation, or it is installed on the front portion of the vehicle body and used for the front confirmation or the side confirmation, or used for the confirmation of the distance from the front vehicle. Such a lens unit for a vehicle-mounted camera is constituted by a plurality of lenses, in particular, an object-side lens disposed on the object side, and an image-side lens group disposed on the image side. The image-side lens group includes a plurality of lenses and an aperture provided between the lenses. Among such a plurality of lenses, the object-side lens has an exposed surface exposed to the outside air, and the transparent member of the present invention is preferably used as a lens having this exposed surface.

Examples of the optical component for outdoor use include a surveillance camera of an outdoor installed type, and the transparent member of the present invention is preferably used as a lens having an exposed surface exposed to the outside air among lenses constituting the surveillance camera.

EXAMPLES

Hereinafter, the present invention will be specifically described with reference to Examples, but the present invention is not limited thereto.

Example 1

As a manufacturing example to give a surface portion where the contact angle changes continuously, a method in which a water-repellent material is vapor-deposited by a vacuum deposition method and the thickness of the water-repellent layer is inclined was adopted.

Base material: Glass base material (TAFI manufactured by HOYA Corporation)

Vacuum deposition apparatus: Film deposition equipment BES-1300 (manufactured by Synchron Co., Ltd.)

Evaporation source of water-repellent material: Resistive heating system

Water-repellent material: SURFCLEAR 100 (SC-100) in a tablet form (manufactured by Canon Optron, Inc.)

The above base material was installed in a vacuum deposition apparatus, then, a mask plate was disposed between the evaporation source and the base material so as to cover half of the base material and to be parallel to the base material, and the base material was eclipsed with the mask plate, whereby the thickness of the water-repellent layer on the base material after vapor-deposition changed continuously. In addition, in order to stabilize the water-repellent layer, the film was left at room temperature for more than half a day after film formation. When the distance between the base material and the mask plate was 3 mm and 10 mm, film formation was performed, respectively, to obtain two transparent members having a water-repellent layer formed on the base material. When 7 μL of water droplets was attached to each of the obtained transparent members, it was confirmed as follows that the water droplets moved from the portion where the mask plate was not disposed (the portion where the thickness of the water-repellent layer was thick) toward the portion where the mask plate was disposed (the portion where the thickness of the water-repellent layer was thin). At this time, it was confirmed that the moving speed of the water droplet was higher when the distance between the base material and the mask plate was smaller (3 mm) than when the distance between the base material and the mask plate was larger (10 mm). Further, it was confirmed that the moving distance of the water droplet was longer when the distance between the base material and the mask plate was larger (10 mm) than when the distance between the base material and the mask plate was smaller (3 mm). The thickness of the water-repellent layer of each transparent member was confirmed. When the distance between the base material and the mask plate was 3 mm and 10 mm, the lengths in the moving directions of the water droplets in the regions where a continuous film thickness gradient of 16 nm to 0 nm was formed were found to be 4 mm and 9 mm, respectively. The contact angle in the region where the thickness of the water-repellent layer was 16 nm was 120°, and the contact angle in the region where the thickness was 0 nm was 30°.

Example 2

A mask plate in which holes were formed was placed between the base material and the evaporation source so that the holes were located at the center of the base material, and a film was formed in the same manner as in Example 1. In addition, a convex lens (diameter 12 mm) was used, the diameter of the hole of the mask plate was set to 6 mm, and the distance between the base material and the mask plate was set to 3 mm. For the obtained transparent member, when the water droplets adhered, it was confirmed that water droplets moved from the portion where the hole portion of the mask plate was arranged (center portion of the base material) towards the radial direction of the portion where the mask plate was arranged. In addition, it was confirmed that the water droplet moved in the outward direction of the base material in the majority of the base material.

In Example 1 and Example 2, experiments were conducted on a transparent member in which a water-repellent layer was formed on a base material, but it was confirmed that water droplets moved in the same manner when an antireflection layer (a laminated layer in which $SiO_2$ (low refractive index layer), OA-600 (high refractive index layer), $SiO_2$ (low refractive index layer), OA-600 (high refractive index layer), and $SiO_2$ (low refractive index layer)) was formed in this order from the base material side on the base material, and a water-repellent layer was formed on the antireflection layer in the same manner as in Examples 1 and 2.

INDUSTRIAL APPLICABILITY

The present invention may be utilized in a transparent member and a method of manufacturing the same, in which water droplets on a surface may be removed by a simple method, and a photographed image may be clearly maintained when used for a lens.

DESCRIPTION OF SYMBOLS

1: Vapor deposition apparatus
2: Chamber
3: Dome
5: Monitoring system
6, 6a, 6b: Evaporation source
7: Layer
12, 12A: Mask plate
21: Holder
22: Holding plate
23: Shaft
24, 25: Nut
AX: Axis
101: Base material
104: Water-repellent layer
201: Antireflection layer

What is claimed is:

1. A transparent member comprising at least a base material or a base material provided with a layer on the base material, wherein the transparent member has a surface portion whose contact angle to water changes continuously,
   wherein the surface portion is included in a water-repellent layer, and
   wherein a thickness of the water-repellent layer changes continuously from a center of the base material in a radial direction.

2. The transparent member described in claim 1, wherein the water-repellent layer contains a fluoride.

3. The transparent member described in claim 1, wherein an antireflection layer is provided on a rear surface of the water-repellent layer.

4. The transparent member described in claim 1, wherein a surface roughness of the surface portion changes continuously.

5. The transparent member described in claim 1, being used in an optical component for vehicle use or outdoor use.

6. The transparent member described in claim 5, wherein the optical component is an optical lens.

7. A method for manufacturing a transparent member described in claim 1, comprising the step of forming the water-repellent layer by forming a water-repellent material, wherein the thickness of the water-repellent layer changes continuously from the center of the base material in the radial direction.

8. The method for manufacturing a transparent member described in claim 7, wherein the step of forming the water-repellent layer uses either a vapor deposition method or a coating method.

9. The transparent member described in claim 1, wherein the water-repellant layer is formed on an entire surface of the base material.

* * * * *